(12) United States Patent
Schmal et al.

(10) Patent No.: US 6,476,593 B1
(45) Date of Patent: Nov. 5, 2002

(54) METHOD AND CIRCUIT FOR COMPENSATION CONTROL OF OFFSET VOLTAGES OF A RADIO RECEIVING CIRCUIT INTEGRATED IN A CIRCUIT MODULE

(75) Inventors: Josef Schmal, München; Stefan Beyer, Mering, both of (DE)

(73) Assignee: Infineon Technologies AG, Munich (DE)

( * ) Notice: Subject to any disclaimer, the term of this patent is extended or adjusted under 35 U.S.C. 154(b) by 109 days.

(21) Appl. No.: 09/680,050

(22) Filed: Oct. 3, 2000

Related U.S. Application Data

(63) Continuation of application No. PCT/DE00/00294, filed on Feb. 1, 2000.

(51) Int. Cl.$^7$ .................. G01R 23/00; H04L 25/06; H04B 1/12
(52) U.S. Cl. .............. 324/76.24; 375/319; 455/296
(58) Field of Search .................. 324/76.24, 76.23, 324/76.58, 76.26, 322, 428, 658, 76.6; 455/324, 283, 284, 296; 375/317, 318, 319, 346; 330/11, 149

(56) References Cited

U.S. PATENT DOCUMENTS

| | | | |
|---|---|---|---|
| 3,699,949 A | * | 10/1972 | O'Hanlon, Jr. et al. .. 324/76.66 |
| 3,729,676 A | * | 4/1973 | Currie et al. ............ 324/76.66 |
| 4,891,576 A | * | 1/1990 | Jacobs .................. 324/72 |
| 5,270,883 A | | 12/1993 | Umeyama |
| 5,444,378 A | * | 8/1995 | Rogers .................. 324/428 |
| 5,699,343 A | | 12/1997 | Moritsugu et al. |
| 6,316,928 B1 | * | 11/2001 | Miyauchi ............... 324/76.27 |
| 6,324,389 B1 | * | 11/2001 | Vaisanen ............... 455/324 |
| 6,331,780 B1 | * | 12/2001 | Hiroshima et al. ......... 324/658 |

FOREIGN PATENT DOCUMENTS

EP  0 561 754 A1  9/1993

* cited by examiner

Primary Examiner—Ernest Karlsen
(74) Attorney, Agent, or Firm—Laurence A. Greenberg; Werner H. Stemer; Gregory L. Mayback

(57) ABSTRACT

A method and circuit for compensation control of offset voltages of a radio receiving circuit integrated in a circuit module that can be used in receiver and transceiver chips for portable mobile radio transceivers, for example in GSM or PCN/PCS systems. In the course of offset voltage compensated in the baseband of a radio receiver, the charge state of a capacitor, which is switched on in a sample-and-hold circuit by predetermined, constant control pulses is evaluated on-chip. The evaluation result is used to match the charging current of a sample operational amplifier to the respective charge state of the capacitor, thereby achieving a minimal compensation time with stable regulation.

7 Claims, 4 Drawing Sheets

METHOD AND CIRCUIT FOR COMPENSATION CONTROL OF OFFSET VOLTAGES OF A RADIO RECEIVING CIRCUIT INTEGRATED IN A CIRCUIT MODULE

CROSS-REFERENCE TO RELATED APPLICATION

This is a continuation of copending International application PCT/DE00/00294, filed Feb. 1, 2000, which designated the United States.

BACKGROUND OF THE INVENTION

FIELD OF THE INVENTION

The invention relates to a method for the compensation control of offset voltages in the baseband of a radio receiving circuit which is integrated in a circuit module and operates using the time division multiplex method (TDMA=time division multiple access) with reception time slots, using a sample operational amplifier which taps off the baseband output signal and, via a sampling switch of a sample-and-hold circuit, which switch is activated by an OCE (offset compensation enable) control signal before each reception time slot for carrying out an offset compensation operation for a defined period of time, charges or discharges an externally fitted capacitor depending on the polarity of the offset voltage, the respective applied voltage of which capacitor is compared with a reference voltage internally in the module by means of a differential amplifier and provides for the generation of a compensation current which counteracts the offset voltage. The invention also relates to a circuit for carrying out the method.

In an integrated radio receiver or radio transceiver circuit module, in the reception path a reception signal (useful signal) present at radio frequency at the antenna is converted firstly into an intermediate frequency (IF) and then, by means of a demodulator (mixer), into baseband (BB).

Offset voltages can occur in this reception path in dependence on production characteristics. These offset voltages are amplified in the same way as the useful signal by the amplifiers in the reception path. If an offset voltage of, say, 20 mV is present at the input of a 16 dB amplifier, then an offset voltage of 126 mV is produced at the output of the amplifier. This high offset voltage leads to the useful signal being limited, since the dynamic range of this amplifier and all subsequent amplifiers in the reception path is reduced by the offset voltage.

In all high-frequency circuit sections (RE and IF), the offset voltage can be eliminated at suitable locations by means of capacitive coupling. However, in the baseband, in which the signal frequencies are about 100 kHz, capacitive coupling is no longer possible, since very large capacitances would have to be used in the integrated circuit module for the capacitive coupling. However, such large capacitances require very long charging times when the circuit module is switched on and take up a considerable chip area or cannot be realized at all on an integrated circuit module.

European Patent application EP 0 693 823 discloses compensating for the offset voltages present in the baseband with the aid of a sample-and-hold circuit.

As is shown in detail by a schematic illustration of such compensation in FIG. 1, to that end the differential baseband signal, which is obtained from the IF signal IF via a demodulator 1 operated with a local oscillator frequency LO and is filtered downstream of a buffer amplifier 2 by means of a low-pass filter 3. The signal is then tapped off internally downstream of a baseband regulating amplifier 4 at the baseband output IR, IRX, which is connected to a downstream baseband processor 5, and is fed to a sample operational amplifier 6.

Via a controlled sampling switch 7 of the sample-and-hold circuit, the sample operational amplifier 6 charges or discharges an externally fitted capacitor C via an output CSHI depending on the polarity of the offset voltage $V_{offset}$. The capacitor voltage is fed to a differential amplifier 8, where it is compared with a reference voltage $V_{Ref}$.

Compensation currents which counteract the offset voltage $V_{offset}$ are generated at the output of the differential amplifier 8. The offset compensation operation is carried out before each reception time slot of the radio receiver operated using time division multiplex (TDMA). To that end, the sampling switch 7 is controlled by means of a so-called OCE (offset compensation enable) control signal OCE in the prior art circuit.

In the prior art, in the case of the pulsed control signal OCE for controlling the compensation operation, the control signal being generated externally in the baseband processor 5, the pulse width is likewise enlarged in the case of large offset voltages.

The relationships in this regard are explained in detail below. Such compensation of the offset voltage $V_{offset}$ in the baseband using a sample-and-hold circuit in accordance with FIG. 1 can be realized in an integrated receiver circuit module—designated by 9—for example, for portable GSM mobile radio transceivers.

The offset voltage compensation operation lasts for a specific period of time, for example 50 $\mu$s in the case of a receiver in the GSM system with its customary TDMA time frames. The offset must have been compensated for in this short period of time. The period of time taken to compensate for an offset that is present depends on the magnitude of the offset voltage, the magnitude of the capacitance of the external capacitor and the magnitude of the charging current of the sample operational amplifier.

The magnitude of the capacitance of the external capacitor and of the charging current must be set such that a typical offset voltage can precisely be corrected in the short time period of, for instance, 50 $\mu$s. The correction or compensation operation could be shortened by reducing the magnitude of the capacitance of the external capacitor and by increasing the charging current. However, this can lead to the regulation becoming unstable and oscillations being produced.

It also happens that the external compensation capacitor is discharged, so that very large offset voltages then occur. This is the case particularly when the radio receiver is switched on for the first time, has been switched off for a relatively long time, or when the capacitor has become discharged for some other reason. In this case, the short available period of time of e.g. 50 $\mu$s is insufficient for compensation of the disturbing offset, since the capacitor would have to be charged considerably more than is possible in this short period of time.

For the reasons mentioned above (instability, oscillation tendency), it is not possible to accelerate the charging by appropriate dimensioning of the sample-and-hold circuit.

To date, therefore, the offset compensation operation has been prolonged. This requires additional computation complexity on the part of the baseband processor. Moreover, on account of the longer duration of the compensation, e.g.

about 200 μs instead of 50 μs, the subsequent reception time slot can no longer be utilized.

If the OCE control signal is not generated by the baseband processor, but in the receiver circuit module itself, then the duration of the respective offset compensation operation is established at a fixed duration of e.g. 50 μs. In this case, therefore, a plurality of compensation cycles would be necessary in order to compensate for a relatively large offset.

SUMMARY OF THE INVENTION

The object of the invention is to provide a method and circuit for compensation control of offset voltages of a radio receiving circuit integrated in circuit module which overcomes the above-noted deficiencies and disadvantages of the prior art devices and methods of t kind, and which make it possible to carry out the offset voltage compensation in the baseband in every instance, tha is to say even when relatively large offset voltages are present during a fixed, defined compensation duration of e. 50 μs in the radio receiver or transceiver chip, without additional computer power being necessary in the baseband processor and without disturbing instability or oscillation tendency of the sample-and-hold circuit being brought about.

With the above and other objects in view there is provided, in accordance with the invention, a method of compensating for offset voltages in a baseband of a radio receiving circuit integrated in a circuit module and operating in a time division multiplex method with reception time slots, the method which comprises the following steps:

feeding a baseband output signal to a controllable sample operational amplifier;

selectively charging or discharging an external capacitor depending on a polarity of an offset voltage, by activating a sampling switch of a sample-and-hold circuit with an offset compensation enable control signal before each reception time slot for a defined period of time;

comparing a voltage of the capacitor with a reference voltage internally in the module with a differential amplifier;

generating a compensation current counteracting the offset voltage;

determining a charge state of the capacitor internally in the module, and, when the capacitor charge is substantially below a typical charge state, increasing the charging current to the capacitor with the controllable sample operational amplifier, and reducing the charging current back to a normal charging current when the charge state of the capacitor attains a charge in the typical charge state range.

In other words, the charge state of the externally fitted compensation capacitor is evaluated on-chip. If the capacitor is discharged or if the instantaneous charge state is far below the typical charge state, then, on the basis of the result obtained in the charge state evaluation, the charging current is increased in the sample operational amplifier. In accordance with one advantageous development of the invention, such a process of increasing the charging current in the sample operational amplifier is performed by switching on an additional current source. With the aid of the increased charging current, the capacitor is now charged significantly faster. When the charge state of the capacitor finally attains the order of magnitude of the typical charge state, the increased charging current generation in the sample operational amplifier is switched back again. The consequence of this is that the remaining compensation of the —now reduced—offset proceeds at the normal speed. The increased charging current is switched back in good time to ensure that the sample-and-hold circuit does not become unstable and, moreover, does not start to oscillate.

The method according to the invention for accelerating the offset voltage compensation as a function of the charge state of the compensation capacitors allows the principle of offset voltage compensation by means of a sample-and-hold circuits also to be used in receiver and transceiver circuits in which a rigid duration of 50 μs, for example, is defined for the offset compensation operation. The method according to the invention enables arbitrarily occurring offset voltages to be compensated for in the predetermined time, without the regulation entering an unstable state or starting to oscillate.

The invention is thus essentially to be seen in the evaluation of the charge state of the compensation capacitor on-chip. The result of this evaluation is then used to match the charging current of the sample operational amplifier to the respective charge state of the compensation capacitor. A minimal offset compensation time with regulation that remains stable is thus achieved.

With the above and other objects in view, there is also provided an integrated circuit module for carrying out the above-outlined method. The circuit comprises:

a charging current evaluation circuit having an input connected to a module-internal feed to an external capacitor and an output, the evaluation circuit having a differential amplifier connected to compare a charge state of the capacitor with a reference charge value;

a controllable sample operational amplifier provided with an additional current source connected via a control signal line to the output of the evaluation circuit and activated via the output if a differential value, ascertained in the differential amplifier, formed from the charge state value of the capacitor and the reference charge value exceeds a defined value, and deactivated if the differential value falls below another defined value.

In other words, the circuit for carrying out the method is characterized in that a charging current evaluation circuit is provided on the integrated circuit module, one input of which evaluation circuit is connected to the module-internal feed to the externally fitted capacitor, in that the evaluation circuit has a differential amplifier, which compares the charge state of the capacitor with the reference charge value, and in that the sample operational amplifier is provided with an additional current source which is connected via a control signal line to the output of the evaluation circuit and is activated via the latter if the differential value—ascertained in the differential amplifier—formed from the charge state value of the capacitor and the reference charge value exceeds a defined value, and is deactivated again if said differential value falls below another defined value again.

The method and the above-specified circuit for carrying out this method can be used particularly advantageously in a small portable mobile radio transceiver (mobile phone) which is used in a mobile radio system operating using time division multiplex (TDMA), for example in a GSM or PCN/PCS mobile radio system.

Other features which are considered as characteristic for the invention are set forth in the appended claims.

Although the invention is illustrated and described herein as embodied in method and circuit for compensation control of offset voltages of a radio receiving circuit integrated in a circuit module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
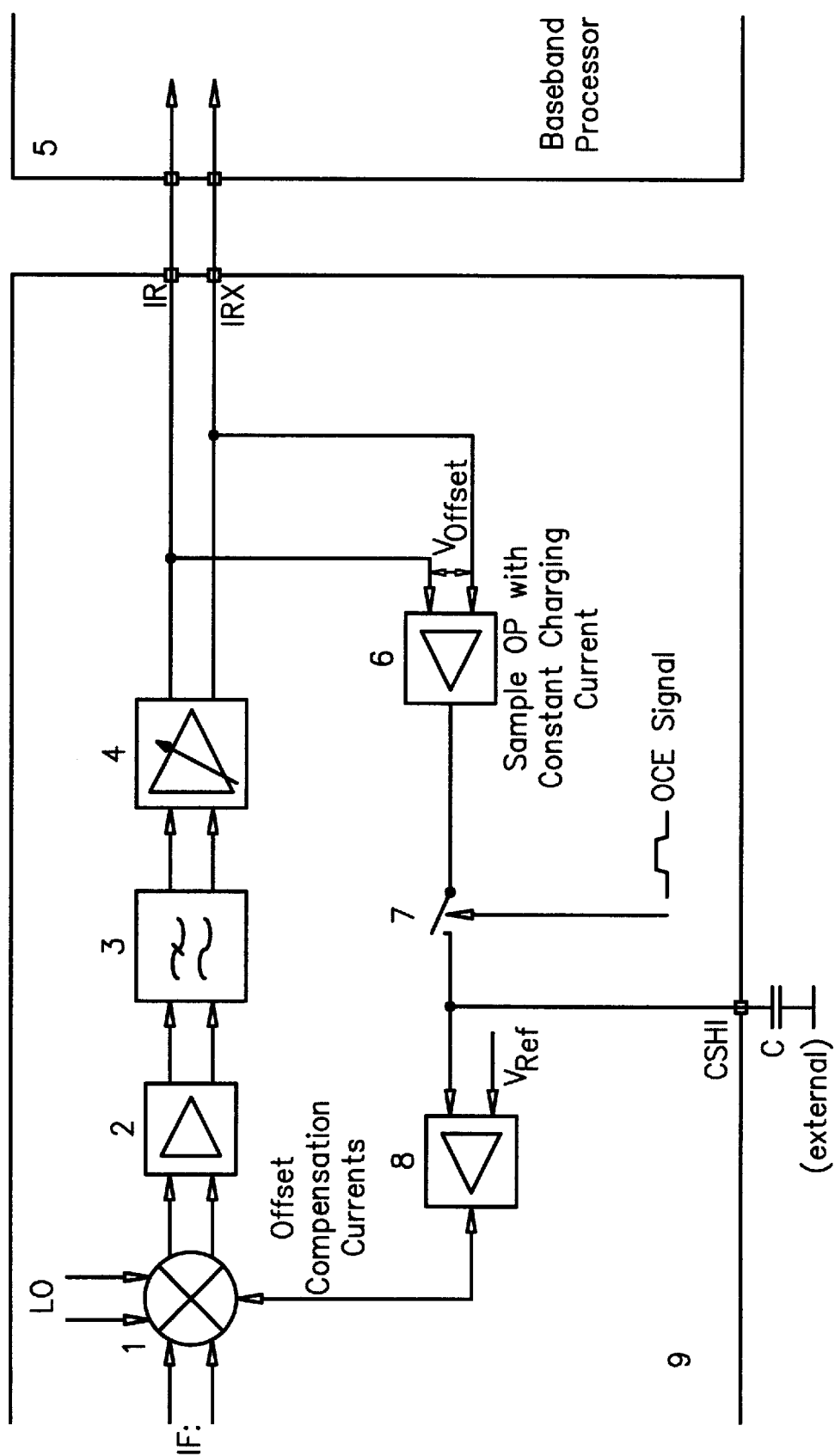
FIG. 1 is a block diagram of an integrated circuit having a sample-and-hold circuit, for elucidating the principle of offset voltage compensation.
Figure 2:
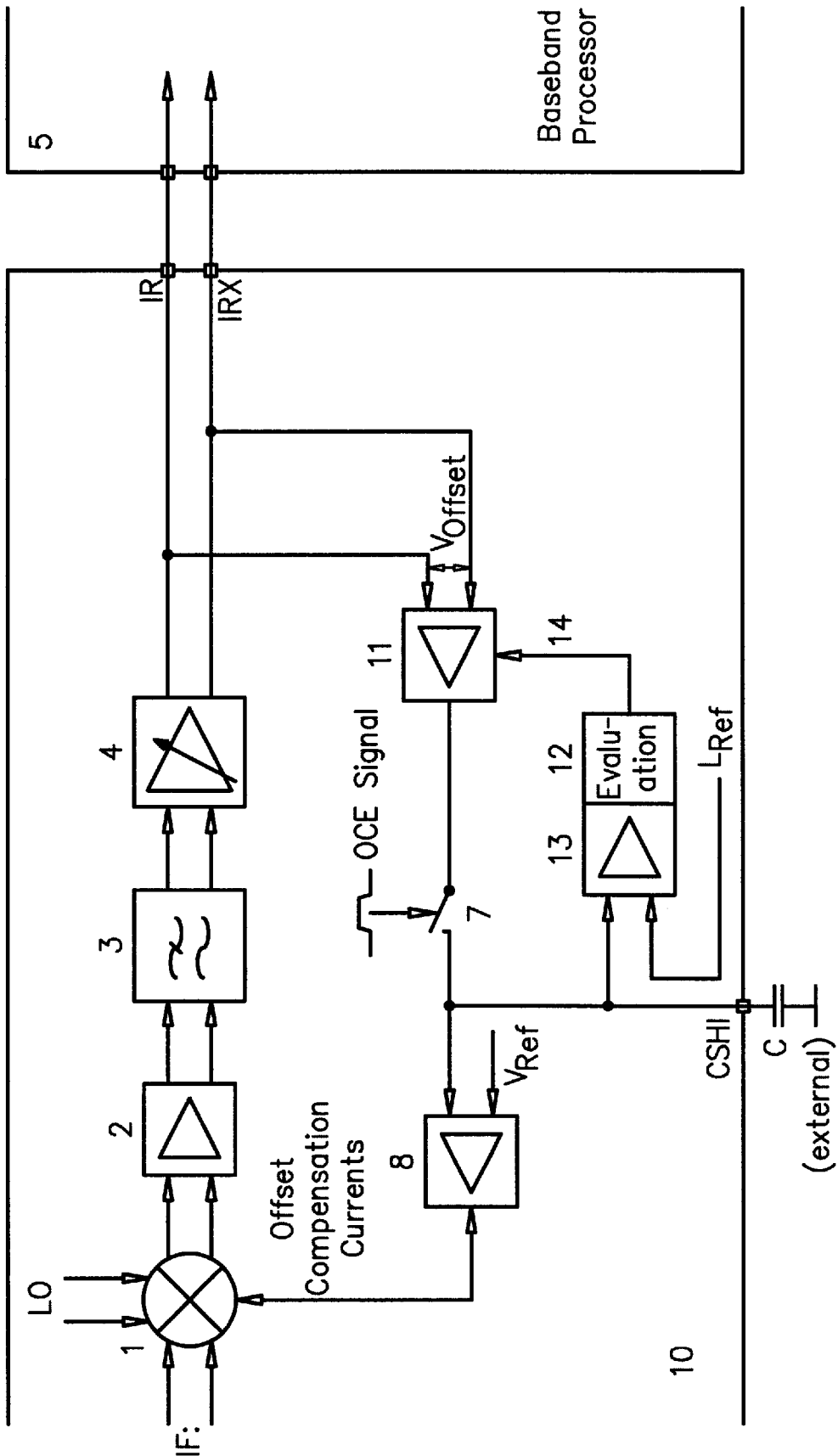
FIG. 2 is a block diagram of an integrated circuit according to the invention, likewise having a sample-and-hold circuit, but having an evaluation circuit for accelerating the offset compensation operation as a function of the charge state of the compensation capacitor.

Referring now to the figures of the drawing in detail and first, particularly, to FIG. 2 thereof, there is seen a circuit in an integrated receiver or transceiver circuit module 10. The circuit carries out the method according to the invention, and it largely corresponds to the circuit shown in FIG. 1. The reference symbols used in FIG. 2 correspond to those used in FIG. 1, explained in the introductory text above.

The offset voltages $V_{offset}$ present in the baseband at the output are likewise compensated for with the aid of a sample and-hold circuit. As is shown in detail in FIG. 2, to that end the differential baseband signal, which is obtained from the IF signal IF with the aid of a demodulator 1 fed with a local oscillator frequency LO and is filtered downstream of a buffer amplifier 2 by means of a low-capacitor filter 3, is tapped off internally after passing through a baseband regulating amplifier 4 at the baseband output IR, IRX, which is connected to a downstream baseband processor 5, and is fed to a sample operational amplifier 11, which is a controllable OP amp. Depending on the polarity of the offset voltage $V_{offset}$, the operational amplifier 11 charges or discharges an externally fitted capacitor C, which forms the hold element of the sample-and-hold circuit, via a controlled sampling switch 7 of the sample-and-hold circuit and via an output CSHI.

The capacitor voltage is fed to a differential amplifier 8, where it is compared with a reference voltage $V_{ref}$. Compensation currents which counteract the offset voltage $V_{offset}$ are generated at the output of the differential amplifier 8. The operation of offset voltage compensation is carried out before each TDMA reception time slot with the aid of the pulsed control signal OCE, which is fed to the control input of the sampling switch 7 and has a constant pulse width of, for example, 50 μs.

The charge state of the externally fitted capacitor C is detected at a differential amplifier 13 connected upstream of a charging current evaluation circuit 12 and is compared with a reference charge state value $L_{ref}$. An additional current source in the sample operational amplifier 11 is switched on or off by means of a control signal passed via a control signal line 14.

If the capacitor C is completely discharged or far below the reference charge state value $L_{ref}$, then the additional current source in the sample operational amplifier 11 is activated. When the charge state of the capacitor C attains the order of magnitude of the reference charge state $L_{ref}$, the additional current source in the sample operational amplifier 11 is switched off again for stability reasons, i.e. the remaining offset voltage compensation no longer proceeds with an increased charging current, but with the standard charging current, that is to say at the normal speed.

Figure 3:
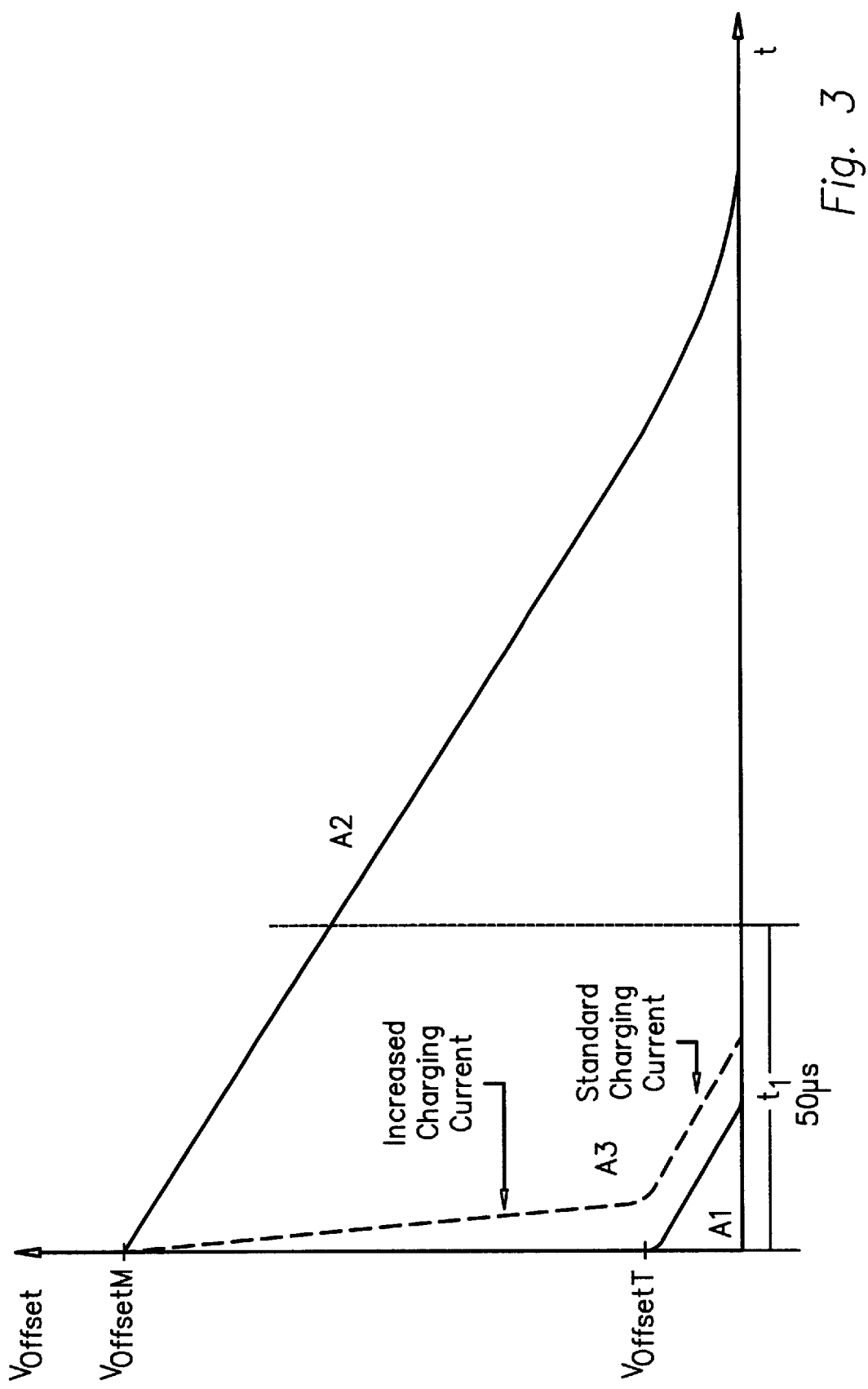
FIG. 3 is a graph showing a comparative illustration of the time profile of the offset voltage during the compensation operation.

The timing chart of FIG. 3 illustrates the profile of the offset voltage $V_{offset}$ as a function of time t during the compensation operation for different cases. The two cases A1 and A2, which are drawn each as a solid function line, represent compensation profiles with in each case a constant charging current in the sample operational amplifier. In case A1, a typical offset voltage $V_{offset}$ is to be compensated for, this being reliably achieved with the constant standard charging current, that is to say without the additional current source being switched on in the sample operational amplifier, before the defined constant compensation time T1 of e.g. 50 μs has elapsed.

In the case A2, by contrast, a maximum offset voltage $V_{offsetM}$ is to be compensated for with the compensation capacitor discharged, which cannot be completely achieved, not by a long way, in the predetermined time t1 of 50 μs. Therefore, in the case A2, the 50 μs are insufficient for compensating for the offset, since the capacitor is to be charged significantly more. Prolonging the duration of the compensation operation e.g. up to 200 μs is disadvantageous, however, owing to the high additional computation complexity in the baseband processor and owing to the fact that the subsequent TDMA reception time slot cannot be utilized.

The dotted line A3 in FIG. 3 shows the profile of the offset voltage during the compensation operation which proceeds with application of the method according to the invention. A maximum offset voltage $V_{offsetM}$ with the compensation capacitor completely discharged is assumed here, as in case A2.

In the course of the evaluation of the charge state, it is initially ascertained that the capacitor is discharged, and, as a consequence of this, the additional current source in the sample operation amplifier of controllable design is switched on, as a result of which the charging current is increased and faster offset compensation is achieved.

This first part of the offset compensation operation is indicated by the steeper part of the dotted line A3 in FIG. 3. When the charge state of the compensation capacitor finally attains the order of magnitude of the typical charge state, e.g. the region of the typical offset voltage $V_{offsetT}$, then, on the basis of the evaluation, the additional current source in the sample operational amplifier is switched off again.

The consequence of this is that the remaining compensation of the—now reduced—offset voltage proceeds with the standard charging current and hence at the normal speed. This second part of the offset compensation operation is indicated by the shallower part of the broken line A3.

Figure 4:
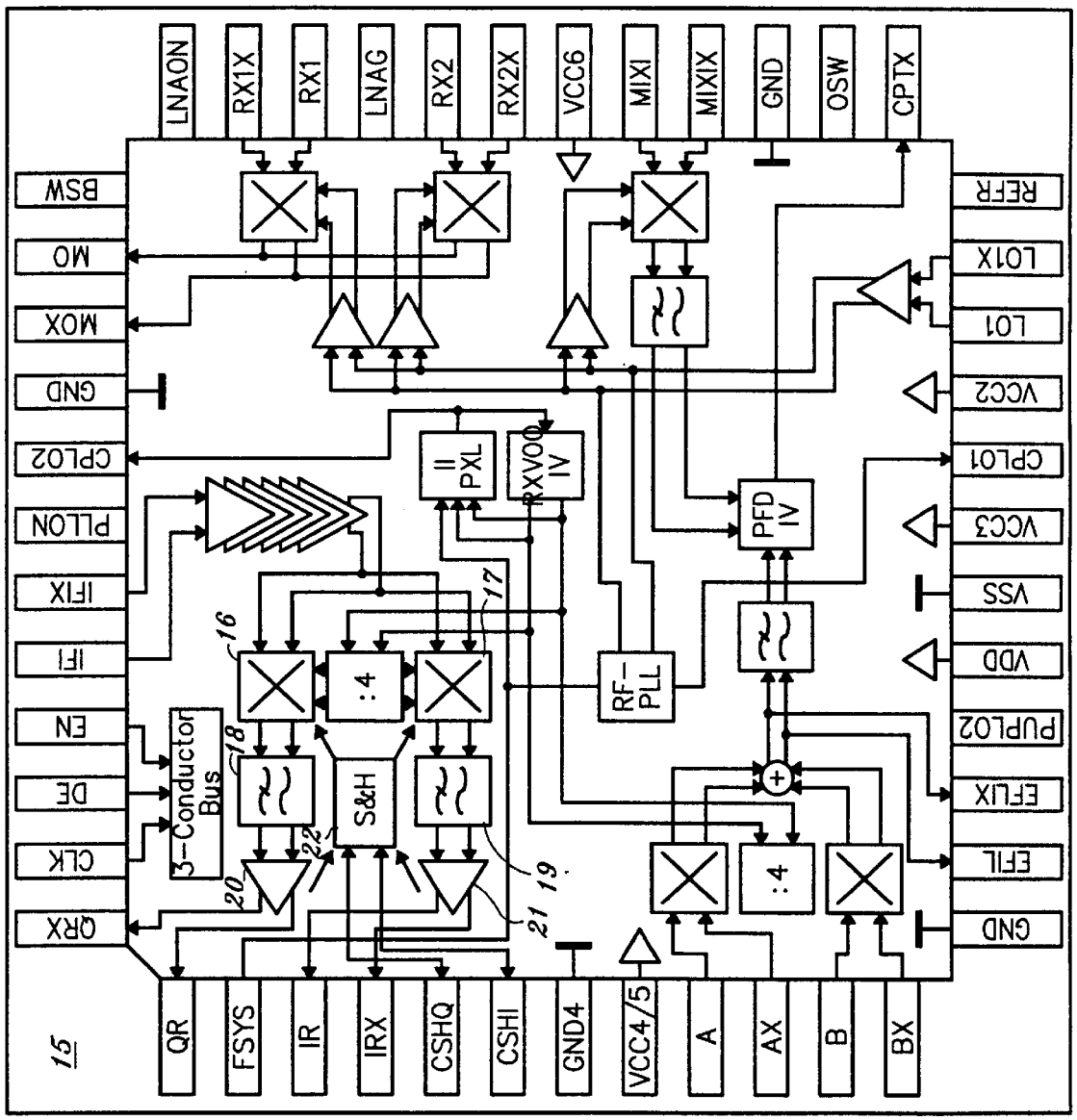
FIG. 4 is a block layout plan of an integrated transceiver module for application of the method according to the invention.

FIG. 4 illustrates a block diagram of an entire transceiver circuit integrated in a circuit module 15. The elements that concern the invention in the reception path section, comprising two differential signal paths (I and Q paths), are the two demodulators 16 and 17, the two low-pass filters 18 and 19, the two differential baseband regulating amplifiers 20 and 21, and also the sample-and-hold circuit (S&H) 22. The latter cooperates via the pins CSHI and CSHQ with external capacitors that are not illustrated in FIG. 4 for reasons of clarity. The elements 16–22 and the terminals CSHI and CSHQ serve for offset compensation, and are illustrated in bold.

The sample-and-hold circuit 22 contains the evaluation circuit for determining the capacitor charging current and the sample operational amplifier, which is provided with the additional current source that can be switched on and which receives the control signal in this regard from the evaluation circuit. FIG. 4 reveals that the integrated transceiver circuit module 15 does not have a dedicated pin for externally feeding the OCE control signal to the sample-and-hold circuit 22, since this control signal is generated internally in the module as a pulsed signal having a predetermined, constant pulse width.

We claim:

1. A method of compensating for offset voltages in a baseband of a radio receiving circuit integrated in a circuit module and operating in a time division multiplex method with reception time slots, the method which comprises the following steps:
    feeding a baseband output signal to a controllable sample operational amplifier;
    charging or discharging an external capacitor depending on a polarity of an offset voltage, by activating a sampling switch of a sample-and-hold circuit in accordance with an offset compensation enable control signal before each reception time slot for a defined period of time;
    comparing a voltage of the capacitor with a reference voltage internally in the module with a differential amplifier;
    generating a compensation current counteracting the offset voltage with the capacitor;
    determining a charge state of the capacitor internally in the module, and, when the capacitor charge is substantially below a typical charge state, increasing the charging current to the capacitor with the controllable sample operational amplifier, and reducing the charging current back to a normal charging current when the charge state of the capacitor attains a charge in the typical charge state range.

2. The method according to claim 1, wherein the step of increasing the charging current in the controllable sample operational amplifier is performed by switching on an additional current source.

3. The method according to claim 1, which comprises compensating an offset voltage in a portable mobile radio transceiver used in a mobile radio system operating in time division multiplex mode.

4. The method according to claim 1, which comprises compensating an offset voltage in a portable mobile radio transceiver used in a GSM or PCN/PCS mobile radio system.

5. An integrated circuit module for carrying out the method according to claim 1, comprising:
    a charging current evaluation circuit having an input connected to a module-internal feed to an external capacitor and an output, said evaluation circuit having a differential amplifier connected to compare a charge state of the capacitor with a reference charge value;
    a controllable sample operational amplifier provided with an additional current source connected via a control signal line to said output of said evaluation circuit and activated via said output if a differential value, ascertained in said differential amplifier, formed from the charge state value of the capacitor and the reference charge value exceeds a defined value, and deactivated if the differential value falls below another defined value.

6. The circuit module according to claim 5, incorporated in a portable mobile radio transceiver used in a mobile radio system operating with time division multiplex.

7. The circuit module according to claim 6, wherein the mobile radio system is a GSM or PCN/PCS mobile radio system.

* * * * *

UNITED STATES PATENT AND TRADEMARK OFFICE
CERTIFICATE OF CORRECTION

PATENT NO.    : 6,476,593 B1
DATED         : November 5, 2002
INVENTOR(S)   : Josef Schmal et al.

It is certified that error appears in the above-identified patent and that said Letters Patent is hereby corrected as shown below:

<u>Title page,</u>
Item [30], should read as follows:

-- Feb. 3, 1999  (DE) ……. 199 04 377.9 --

Signed and Sealed this

Twenty-fifth Day of February, 2003

JAMES E. ROGAN
*Director of the United States Patent and Trademark Office*